(12) United States Patent
Lin et al.

(10) Patent No.: US 9,363,927 B2
(45) Date of Patent: Jun. 7, 2016

(54) ELECTRICAL SIGNAL COMPUTING MODULE CAPABLE OF ACCOMMODATING PRINTED CIRCUIT BOARD

(71) Applicant: Lanner Electronic Inc., New Taipei (TW)

(72) Inventors: Tse-Min Lin, New Taipei (TW); Wen-Lung Lee, New Taipei (TW)

(73) Assignee: LANNER ELECTRONIC INC. (TW)

( * ) Notice: Subject to any disclaimer, the term of this patent is extended or adjusted under 35 U.S.C. 154(b) by 125 days.

(21) Appl. No.: 14/484,264

(22) Filed: Sep. 12, 2014

(65) Prior Publication Data

US 2016/0081228 A1    Mar. 17, 2016

(51) Int. Cl.
*H05K 7/20* (2006.01)
*H05K 7/14* (2006.01)

(52) U.S. Cl.
CPC .......... *H05K 7/20736* (2013.01); *H05K 7/1492* (2013.01)

(58) Field of Classification Search
CPC ................... G06F 1/20–1/206; H05K 7/1492; H05K 7/20736
USPC ................... 361/679.046–679.054, 688–723, 361/796–800
See application file for complete search history.

(56) References Cited

U.S. PATENT DOCUMENTS

| | | | | |
|---|---|---|---|---|
| 5,793,608 A * | 8/1998 | Winick | ...................... | G06F 1/20 257/E23.099 |
| 6,590,768 B1 * | 7/2003 | Wiley | ...................... | G06F 1/183 257/E23.099 |
| 9,223,362 B2 * | 12/2015 | Watanabe | ........... | H05K 7/20736 |
| 9,271,425 B1 * | 2/2016 | Lin | ....................... | H05K 7/1492 |
| 2004/0037034 A1 * | 2/2004 | Suzuki | ....................... | G06F 1/20 361/679.33 |
| 2011/0273841 A1 * | 11/2011 | Paquin | ................ | H05K 7/20727 361/679.48 |
| 2013/0107454 A1 * | 5/2013 | Wilke | ................. | H05K 7/20727 361/694 |
| 2013/0329364 A1 * | 12/2013 | Kameno | ............ | H05K 7/20563 361/697 |
| 2014/0118926 A1 * | 5/2014 | Santos | ....................... | G06F 1/20 361/679.48 |
| 2014/0141707 A1 * | 5/2014 | Carlson | ...................... | G06F 1/20 454/184 |
| 2014/0340846 A1 * | 11/2014 | Kurita | ................. | H05K 7/20727 361/695 |
| 2014/0342652 A1 * | 11/2014 | Dong | ....................... | F24F 7/007 454/184 |
| 2015/0070829 A1 * | 3/2015 | Ning | ................... | H05K 7/20727 361/679.33 |
| 2016/0037673 A1 * | 2/2016 | Chen | .................... | H05K 7/1489 361/679.02 |

* cited by examiner

*Primary Examiner* — Anthony Haughton
*Assistant Examiner* — Matt Dhillon

(57) ABSTRACT

The present invention is an electrical signal computing module capable of accommodating printed circuit board, able to lead the exterior air into the main case body, exchange heat with the printed circuit boards, without accumulation of heat and damage of the printed circuit board. The present invention has a main case body with a bottom case and an internal board set, and four accommodating areas are formed by the internal board set and a transmission circuit board, in addition, numerous flow holes disposed at specific position are designed for air flowing in, exchanging heat produced by printed circuit boards as well.

11 Claims, 11 Drawing Sheets

ELECTRICAL SIGNAL COMPUTING MODULE CAPABLE OF ACCOMMODATING PRINTED CIRCUIT BOARD

BACKGROUND OF THE INVENTION

1. Field of the Invention

The present invention relates to a heat exchanger, especially to a structure for heat exchanger used to accommodate printed circuit board and electrical device.

2. Description of Related Art

The electrical component used in electrical product including resistance, conductance or even central processing unit can produce heat during work, over accumulation of heat rises temperature inside the electrical product, and may cause component damage, so the heat exchanger exchange heat for decrease the temperature. The blower disposed inside electrical device is common in conventional skill to change heat. The air produced by blower has efficient heat transfer to cool down the electrical component. Heat exchanging tube and heat sink disposed on electrical component or in the electrical device are also common used in conventional skill to exchange heat, the exchanging tube can transfer heat, and the heat sink has broad heat exchanging surface, both can cool down the electrical component.

Generally, a heat sink set is disposed on the central processing unit in server system, wherein the heat sink set has broad surface to exchange heat with air, and the heat from the central processing unit can be transferred to air. The heat from the central processing unit can be transferred through the heat sink set, however, the heat may transfer to other electrical component, and over rises temperature of other electrical component, thus, the heat sink set is not enough for server system to exchange heat, the further consideration of convection is necessary to exclude the heat and to have sufficient heat exchanging.

The air flow through the heat sink set to remove and absorb the heat produced by the central processing unit, the temperature of the air is rose, the air then flow to other electrical component, so the heat of other electrical component is hard to exchange with the air, the electrical component has high temperature. To overcome this disadvantage, the air flow rate is increased in the conventional skill by adding the power of the blower, so the amount of the air flow through server system is increased. However, adding the power of the blower means the addition of the loading on the server system, the blower produces more heat, as a result, the overall heat produced by system is the same. Besides, to enhance utilization, designer always try to cut down the size of the server system, thus, the internal space in terms of air flow should be designed well to obtain the heat exchanging as request.

To improve a better performance for server system, the electrical component has smaller size as age, so the electrical components designed on the circuit board inside the server system have high closeness too. Each electrical component produces certain heat, more electrical component means more heat produced, thus, the design of the convection and heat exchanging in server system can be important. The cooling server system or the heat exchanging in terms of convection and structure should be considered detail to meet the heat exchanging request which is produced by the server system due to high performance.

The inventor of the present invention based on years of practice experience in the related industry to conduct extensive researches and experiments, and finally developed an electrical signal computing module capable of accommodating printed circuit board in accordance with the present invention to overcome the drawbacks of the prior art.

SUMMARY OF THE INVENTION

The follow summary is related to abbreviated introduction of the present invention, to provide basic concept of the present invention from certain respect. It only provides a concept in abbreviation form, to be preface to the detail description as follow.

Accordingly, an object of the present invention is to provide an electrical signal computing module capable of accommodating printed circuit board, the exterior air can be lead into the main case body to exchange heat produced by the printed circuit boards, so the heat can be removed and lead out of the main case body efficiently, without accumulation of heat and damage of the printed circuit board; moreover, instead having PC liquid cooling system occupying, the structure of the present invention is designed according to the fluid mechanics under discretion to the efficiency of the heat exchange, so that, the cost can be saved and controlled by efficient heat exchange and space usage.

Therefore, it is a primary objective of the invention to provide an electrical signal computing module capable of accommodating printed circuit board, comprising: a main case body, including: a bottom case, having an external right side board and an external left side board, wherein the external right side board has a first external flow hole and a second external flow hole; an internal board set, being disposed within the bottom case, and further including: a front right side board, fixing to the external right side board, and having a front side flow hole; wherein air flows in sequence through the second external flow hole and the front side flow hole into the main case body; a front middle board, having a front middle flow hole; a rear right side board, fixing to the external right side board, and having a plurality of rear right side flow holes; wherein the rear right side flow holes are formed by the first external flow hole; a rear middle board; and a rear left side board, fixing to the external left side board; a transmission circuit board, being disposed within the bottom case, and having a plurality of transmission flow holes; wherein a first accommodating area is formed by the transmission circuit board, the front right side board and the front middle board; a second accommodating area is formed by the transmission circuit board, the front middle board and the external left side board; a third accommodating area is formed by the transmission circuit board, the rear right side board and the rear middle board; a forth accommodating area is formed by the transmission circuit board, the rear middle board and the rear left side board; wherein the air flows in sequence through the first external flow hole and the rear right side flow holes into the third accommodating area; wherein the air flows from the third accommodating area through the transmission flow holes into the first accommodating area; wherein the air flows from the second accommodating area through the front middle flow hole into the first accommodating area; a first main circuit board module, being disposed in the first accommodating area, connecting to the transmission circuit board, and further having a plurality of lower blowers, a first side heat leading tunnel, a second side heat leading tunnel, a first main processor, a second main processor, a side heat flow hole and a plurality of memory devices; wherein the lower blowers are disposed in front of the first main circuit board module, and draw the air out of the first accommodating area; the first side heat leading tunnel is disposed on right side of the first main circuit board module, and close to the side heat flow hole; the second side heat leading tunnel is disposed on left side of the first main circuit board module; the first main processor is disposed on the first main circuit board module and close to the transmission circuit board; the second main processor is disposed on the first main circuit board module and close to the first side heat leading tunnel; the side heat flow hole is disposed on right side of the first main circuit board module; the memory devices flank the second main processor; wherein the lower blowers draw the air out of the first accommodating area, so the air from external of the bottom case flows in sequence through the front side flow hole and the side heat flow hole into the first accommodating area and the second main processor; and a second main circuit board module, being disposed in the first accommodating area, and being above the first main circuit board module, also connecting to the transmission circuit board; wherein the second main circuit board module has a plurality of upper blowers, the upper blowers are disposed in front of the second main circuit board module, and draw the air out of the first accommodating area; wherein, the lower blowers and the upper blowers draw the air out of the first accommodating area, so the air in the third accommodating area flows into the first accommodating area, and the air in the forth accommodating area flows into the second accommodating area; wherein the air on the first main circuit board module flows through the first main processor, the memory devices and the second main processor, the lower blowers then draw the air out of the first accommodating area; wherein the air in the second accommodating area flows through the front middle flow hole into the second main circuit board module, the upper blowers then draw the air out of the first accommodating area.

In one embodiment of the present invention, the rear right side board further has a plurality of first printed circuit board supporters formed at interior of the rear right side flow holes respectively; the rear middle board has a plurality of second printed circuit board supporters corresponding to the first printed circuit board supporters; a plurality of internet printed circuit boards are disposed in the third accommodating area, connecting to the transmission circuit board; wherein each internet printed circuit board is supported by the first printed circuit board supporter and the second printed circuit board supporter.

In one embodiment of the present invention, the rear right side board further has a rear right side flow hole formed at side of the rear right side board, and communicating to the first external flow hole; one of the transmission flow holes is formed at side of the transmission circuit board, and communicates with the rear right side flow hole; wherein the air flows through the first external flow hole, the rear right side flow hole and the transmission flow hole in sequence to the first accommodating area, then the air is led by the first side heat leading tunnel to the second main processor.

Moreover, one of the transmission flow holes is formed at upper transmission circuit board, so the air in the third accommodating area flows through the transmission flow hole into the first accommodating area and the second main circuit board module; wherein one of the transmission flow holes is formed at lower transmission circuit board, so the air in the third accommodating area flows through the transmission flow hole into the first accommodating area, then flows through the first main circuit board module including the first main processor.

The present invention further has a power supplier, being disposed in the second accommodating area, drawing the air out of the second accommodating area, and connecting to the transmission circuit board; and a plurality of the data storage devices, being stacked and disposed in the forth accommodating area, and connecting to the transmission circuit board.

For more detail, a first leading surface is formed at the first side heat leading tunnel, and the first side heat leading tunnel connects to the lower blowers; the air flows into the first accommodating area through the side heat flow hole, then flows to the second main processor along with the first leading surface, and the lower blowers draw the air out of the first accommodating area.

For more detail, the first main circuit board module further has a host bridge microchip closed to the second side heat leading tunnel; the second side heat leading tunnel has a distribution flow hole, and two second leading surfaces are formed on the second side heat leading tunnel; the air flows to the second side heat leading tunnel, and the distribution flow hole distributes the air to flow on the second side heat leading tunnel; wherein the air flows from the third accommodating area to the first accommodating area, through the host bridge microchip along with one second leading surface, and the lower blowers draw the air out of the first accommodating area along with another second leading surface.

DETAILED DESCRIPTION OF THE PREFERRED EMBODIMENTS

Figure 1:
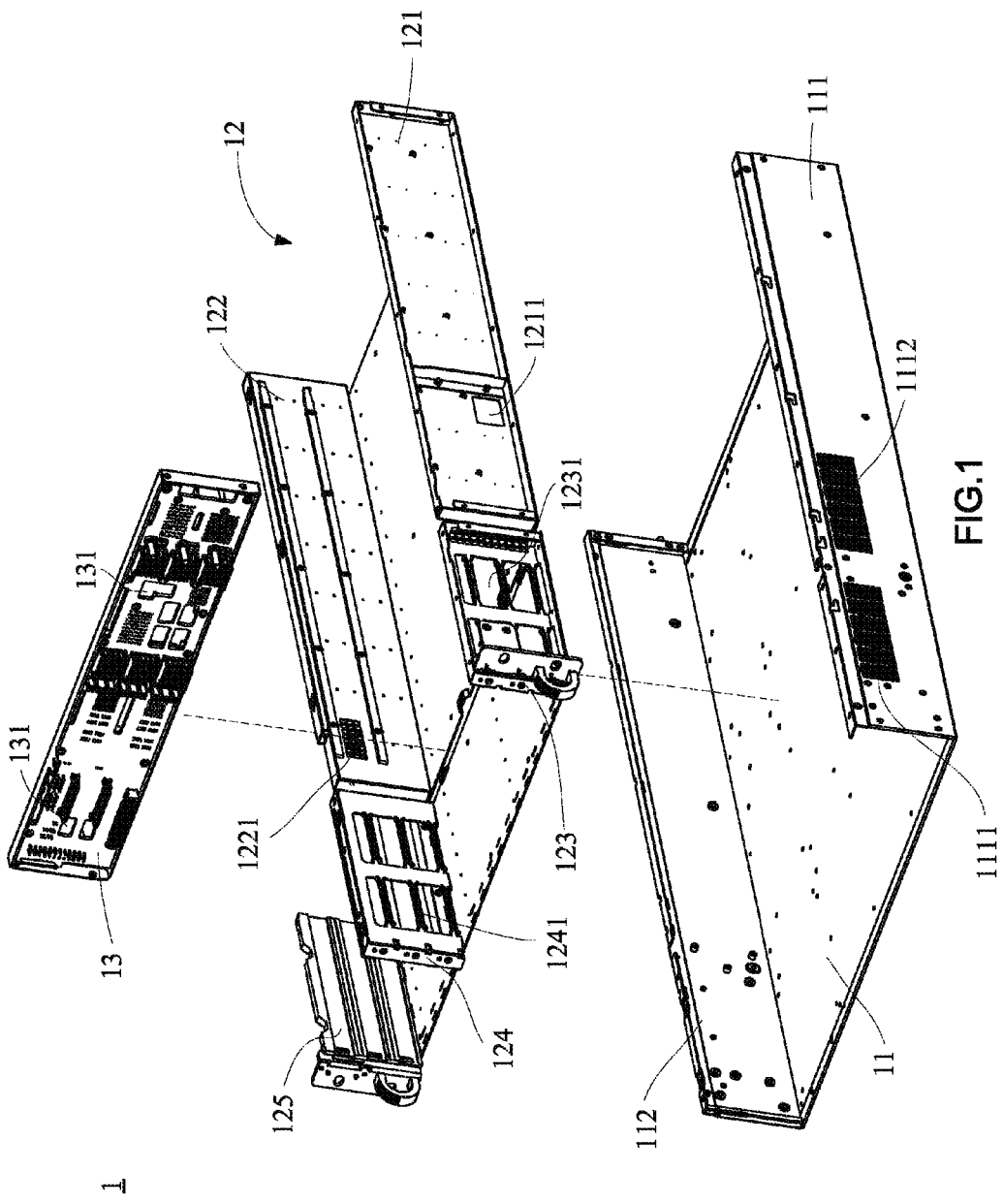
FIG. 1 demonstrates an exploded view of the main case body according to the present invention.

The technical contents and characteristics of the present invention will be apparent with the detailed description of a preferred embodiment accompanied with related drawings as follows. It is noteworthy that the drawings are provided for the purpose of illustrating the present invention, but not intended for limiting the scope of the invention.

The electrical signal computing module mentioned in the present invention is related to an advanced telecommunications computing architecture. Please refer to FIG. 1 to FIG. 4, the FIG. 1 demonstrates an exploded view of the main case body according to the present invention, FIG. 2 demonstrates a top plan view of the main case body according to the present invention, FIG. 3 demonstrates a top plan view of the first main circuit board module according to the present invention, FIG. 4 demonstrates the first main circuit board module and the second main circuit board module being disposed in the first accommodating area according to the present invention. As shown in FIGS. 1 to 4, the present invention provides an electrical signal computing module capable of accommodating printed circuit board, comprising: a main case body 1, including: a bottom case 11, having an external right side board 111 and an external left side board 112, wherein the external right side board 111 has a first external flow hole 1111 and a second external flow hole 1112; an internal board set 12, being disposed within the bottom case 11, and further including: a front right side board 121, fixing to the external right side board 111, and having a front side flow hole 1211; wherein air flows in sequence through the second external flow hole 1112 and the front side flow hole 1211 into the main case body 1; a front middle board 122, having a front middle flow hole 1221; a rear right side board 123, fixing to the external right side board 111, and having a plurality of rear right side flow holes 1231; wherein the rear right side flow holes 1231 are formed by the first external flow hole 1111; a rear middle board 124; and a rear left side board 125, fixing to the external left side board 112; a transmission circuit board 13, being disposed within the bottom case 11, and having a plurality of transmission flow holes 131; wherein a first accommodating area 21 is formed by the transmission circuit board 13, the front right side board 121 and the front middle board 122; a second accommodating area 22 is formed by the transmission circuit board 13, the front middle board 122 and the external left side board 112; a third accommodating area 23 is formed by the transmission circuit board 13, the rear right side board 123 and the rear middle board 124; a forth accommodating area 24 is formed by the transmission circuit board 13, the rear middle board 124 and the rear left side board 125; wherein the air flows in sequence through the first external flow hole 1111 and the rear right side flow holes 1231 into the third accommodating area 23; wherein the air flows from the third accommodating area 23 through the transmission flow holes 131 into the first accommodating area 21; wherein the air flows from the second accommodating area 22 through the front middle flow hole 1221 into the first accommodating area 21; a first main circuit board module 14, being disposed in the first accommodating area 21, connecting to the transmission circuit board 13, and further having a plurality of lower blowers 141, a first side heat leading tunnel 142, a second side heat leading tunnel 143, a first main processor 144, a second main processor 145, a side heat flow hole 146 and a plurality of memory devices 147; wherein the lower blowers 141 are disposed in front of the first main circuit board module 14, and draw the air out of the first accommodating area 21; the first side heat leading tunnel 142 is disposed on right side of the first main circuit board module 14, and close to the side heat flow hole 146; the second side heat leading tunnel 143 is disposed on left side of the first main circuit board module 14; the first main processor 144 is disposed on the first main circuit board module 14 and close to the transmission circuit board 13; the second main processor 145 is disposed on the first main circuit board module 14 and close to the first side heat leading tunnel 142; the side heat flow hole 146 is disposed on right side of the first main circuit board module 14; the memory devices 147 flank the second main processor 145; wherein the lower blowers 141 draw the air out of the first accommodating area 21, so the air from external of the bottom case 11 flows in sequence through the front side flow hole 1211 and the side heat flow hole 146 into the first accommodating area 21 and the second main processor 145; and a second main circuit board module 15, being disposed in the first accommodating area 21, and being above the first main circuit board module 14, also connecting to the transmission circuit board 13; wherein the second main circuit board module 15 has a plurality of upper blowers 151, the upper blowers 151 are disposed in front of the second main circuit board module 15, and draw the air out of the first accommodating area 21; wherein, the lower blowers 141 and the upper blowers 151 draw the air out of the first accommodating area 21, so the air in the third accommodating area 23 flows into the first accommodating area 21, the air in the forth accommodating area 24 flows into the second accommodating area 22 as well; wherein the air on the first main circuit board module 14 flows through the first main processor 144, the memory devices 147 and the second main processor 145, the lower blowers 141 then draw the air out of the first accommodating area 21; wherein the air in the second accommodating area 22 flows through the front middle flow hole 1221 into the second main circuit board module 15, the upper blowers 151 then draw the air out of the first accommodating area 21.

In the present invention, the front right side board 121 and the front middle board 122 are disposed side by side with equal length, and fixed on one plan. The rear right side board 123, the rear middle board 124 and the rear left side board 125 are disposed side by side with length, and fixed on one plan. The internal board set 12 is formed by the front right side board 121, the front middle board 122, the rear right side board 123, the rear middle board 124 and the rear left side board 125. The internal board set 12 is disposed within the bottom case 11, the transmission circuit board 13 is then disposed within the bottom case 11. The transmission circuit board 13 is electrical device, might be replaced when component broken or replaced as specification changed. The internal board set 12 is simply mechanical structure, rarely being changed. Thus, the transmission circuit board 13 is disposed after the internal board set 12 for changing easily.

The second main circuit board module 15 is stacked on the first main circuit board module 14 and disposed in the first accommodating area 21. The first main circuit board module 14 and the second main circuit board module 15 both used to compute and process the electrical signal including internet signal. The first main circuit board module 14 and the second main circuit board module 15 produce heat during computing or processing the electrical signal. The heat gathers in the first accommodating area 21 as computing electrical signal, so the first accommodating area 21 has amount of heat in a period, and the component computing electrical signal further has damage due to overheat. Therefore, the lower blowers 141 and the upper blower 151 are disposed on the first main circuit board module 14 and the second main circuit board module 15 to exclude the heat produced during computing and processing electrical signal, instead of overheat risk.

Figure 5:
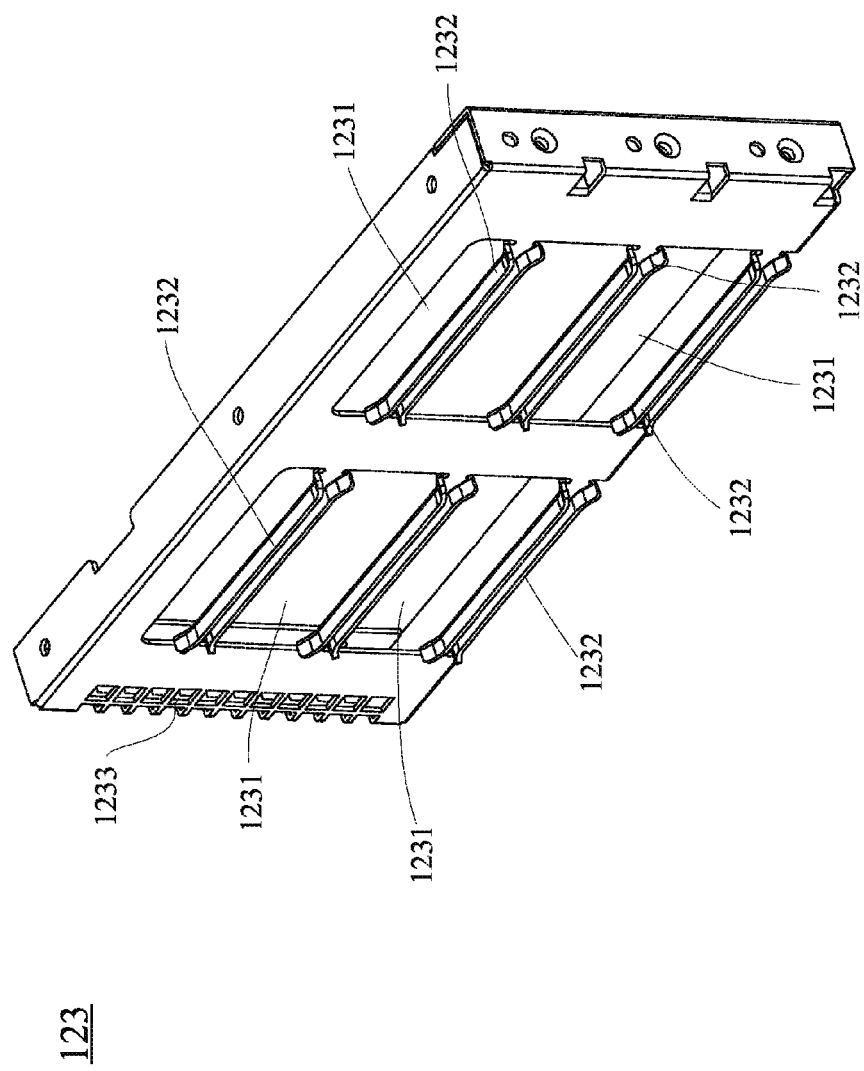
FIG. 5 demonstrates a stereo view of the rear right side board according to the present invention.
Figure 6:
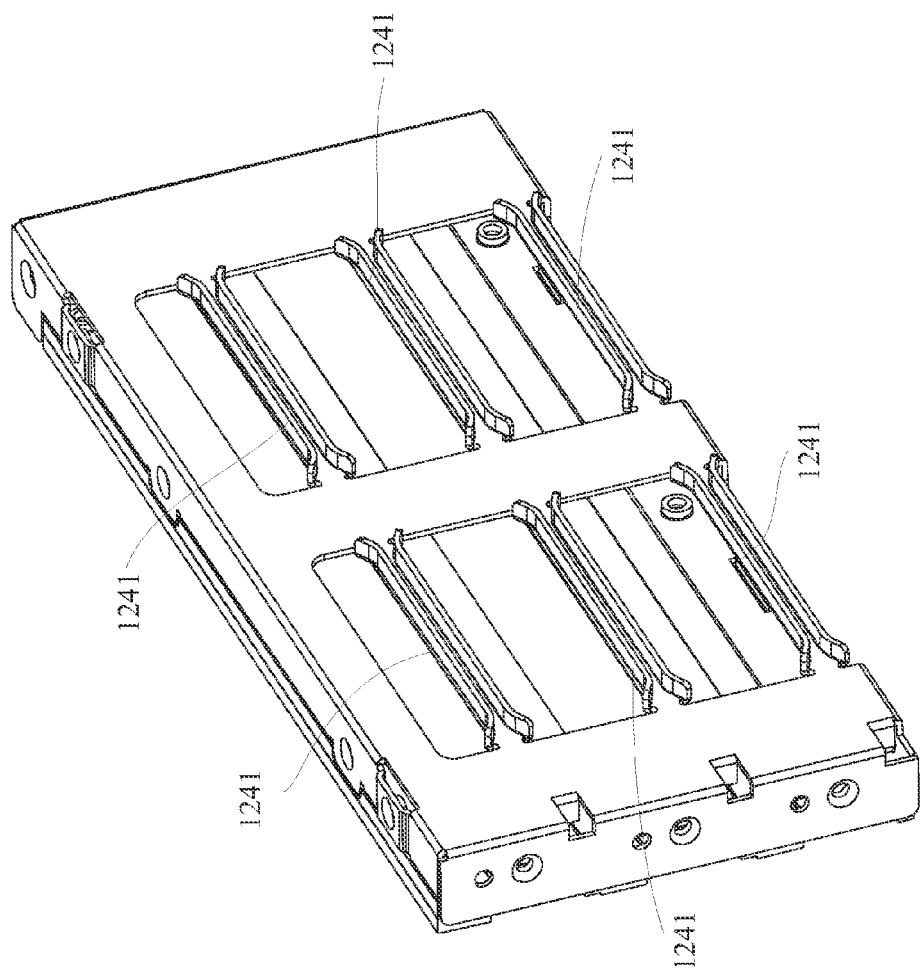
FIG. 6 demonstrates a stereo view of the rear middle board according to the present invention.
Figure 7:
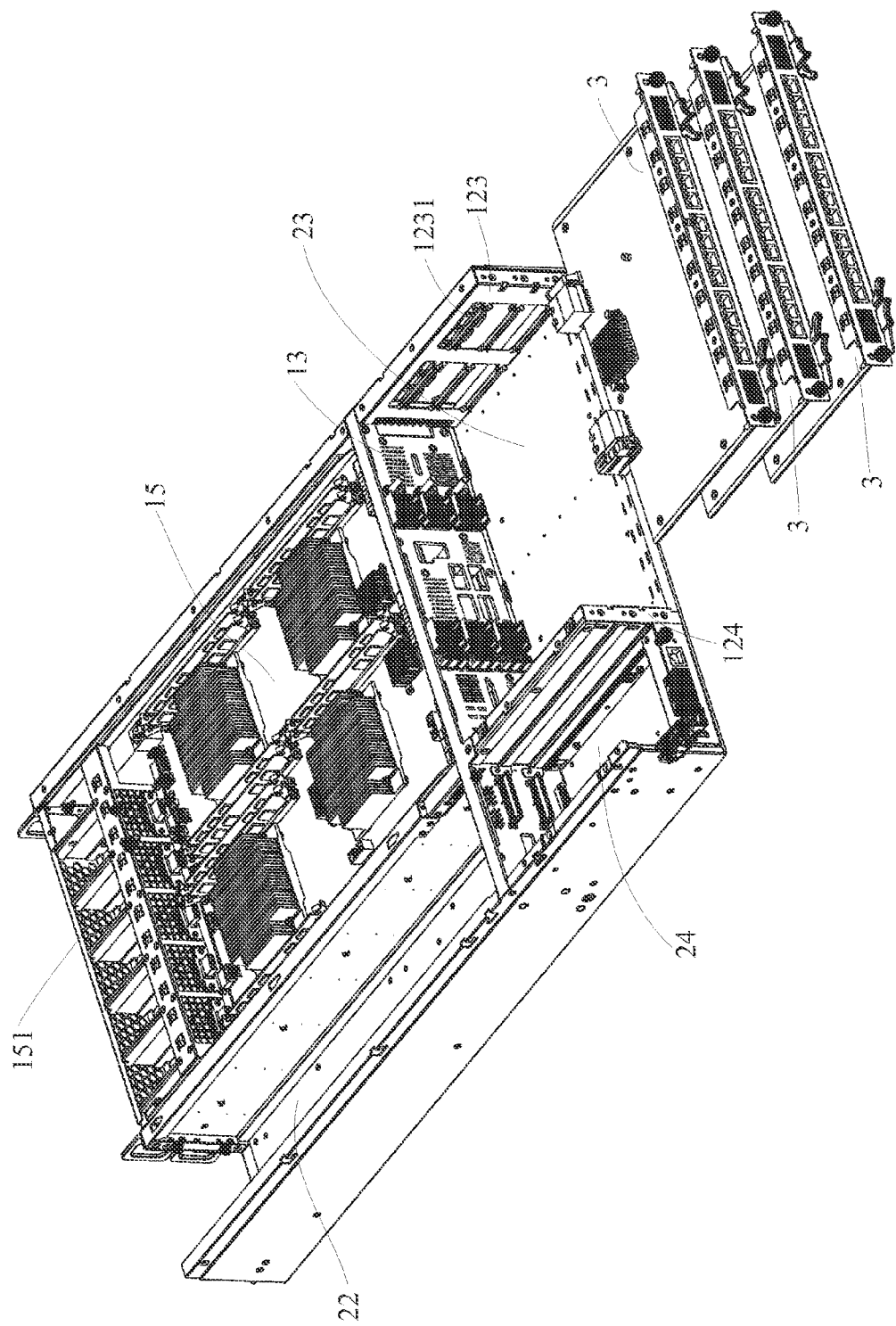
FIG. 7 demonstrates a stereo view of the internet printed circuit board being inserted into the main case body according to the present invention.

Please refer to the FIG. 5 to FIG. 7, FIG. 5 demonstrates a stereo view of the rear right side board according to the present invention, FIG. 6 demonstrates a stereo view of the rear middle board according to the present invention, and FIG. 7 demonstrates a stereo view of the internet printed circuit board being inserted into the main case body according to the present invention. As shown in FIG. 5 to FIG. 7, the rear right side board 123 further has a plurality of first printed circuit board supporters 1232 formed at interior of the rear right side flow holes 1231 respectively; the rear middle board 124 has a plurality of second printed circuit board supporters 1241 corresponding to the first printed circuit board supporters 1232; moreover, a plurality of internet printed circuit boards 3 being disposed in the third accommodating area 23, connecting to the transmission circuit board 13; wherein each internet printed circuit board 3 is supported by the first printed circuit board supporter 1232 and the second printed circuit board supporter 1241. The first printed circuit board supporters 1232 and the second printed circuit board supporters 1241 are flat and formed toward inside of the third accommodating area 23; in addition, each first printed circuit board supporter 1232 corresponds to each second printed circuit board supporter 1241, thus, the internet printed circuit board 3 can be supported in flat and steady. The internet printed circuit board 3 is able to receive internet signal from global computer network, translate and process the internet signal, and send the internet signal to the first main circuit board module 14 and the second main circuit board module 15 through the transmission circuit board 13 to further process and computing. The electrical signal computing module can process the internet signal faster with more internet printed circuit boards 3, however, more internet printed circuit boards 3 request more space, the third accommodating area 23 has to expand, so the overall size of the electrical signal computing module is changed, and the heat exchange might be different. In the present invention, the electrical signal computing module has three internet printed circuit boards 3, and the three internet printed circuit boards 3 has the same height as the second main circuit board module 15 being stacked on the first main circuit board module 14, so that, the effectiveness, heat exchange and overall size can be balance with best performance. Nevertheless, the thickness of the internet printed circuit board 3 can be modified as custom, the electrical signal computing module is able to include the internet printed circuit board 3 more than three with smaller thickness.

Figure 8:
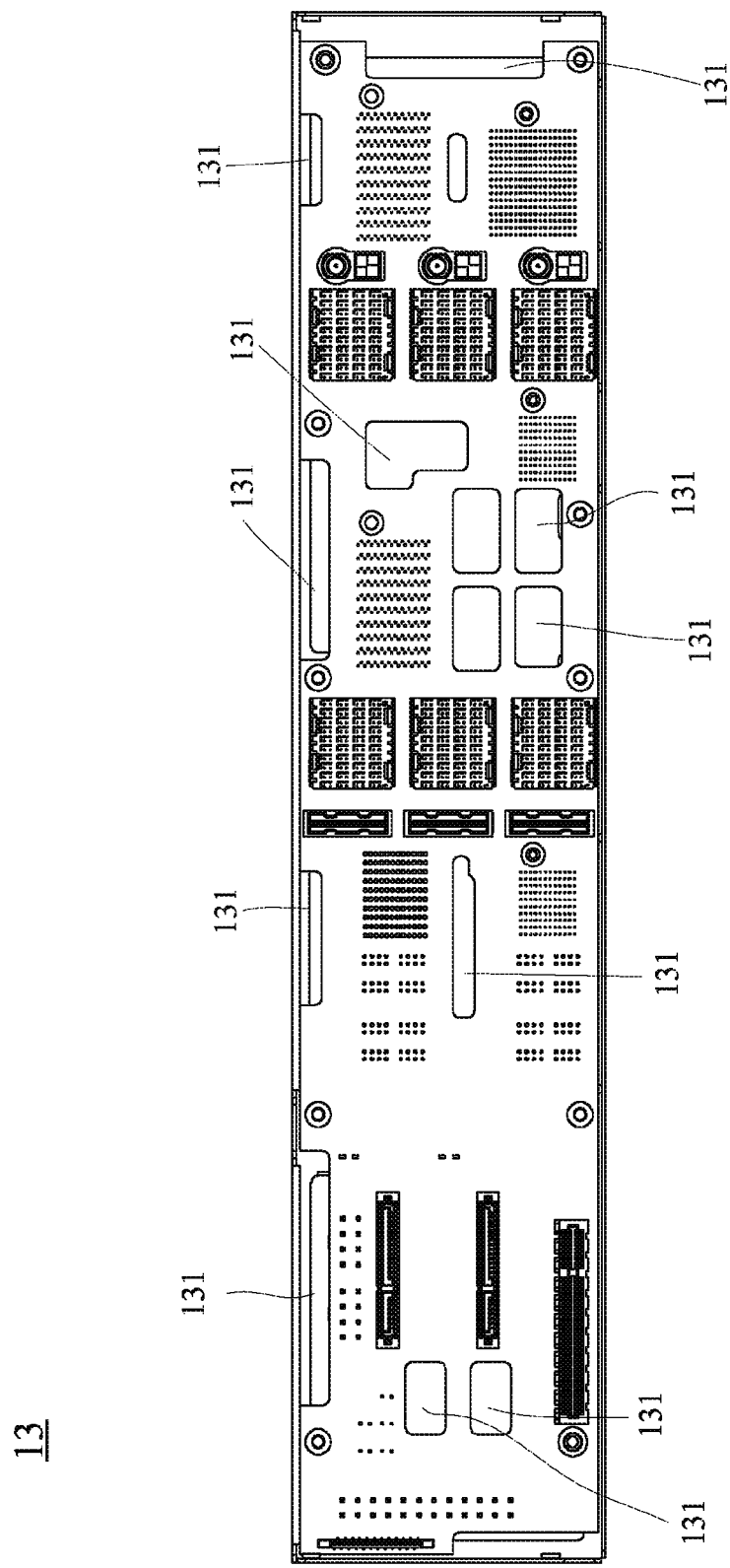
FIG. 8 demonstrates a rear view of the transmission circuit board according to the present invention.

Please refer to FIG. 8 demonstrating a rear view of the transmission circuit board according to the present invention. As shown in FIGS. 1, 2, 4, 5 and 8, the rear right side board 123 further has a rear right side flow hole 1233 formed at side of the rear right side board 123, and communicating to the first external flow hole 1111; one of the transmission flow holes 131 is formed at side of the transmission circuit board 13, and communicates with the rear right side flow hole 1233; wherein the air flows through the first external flow hole 1111, the rear right side flow hole 1233 and the transmission flow hole 131 in sequence to the first accommodating area 21, then the air is led by the first side heat leading tunnel 142 to the second main processor 145. The corner easily has turbulence during heat exchange. To reduce turbulence, the present invention utilizes the air in the corner with best performance for heat exchange, and designs the rear right side flow hole 1233, so the air in the corner can flow smooth without turbulence, and the heat exchange has the best performance. The rear right side flow hole 1233 of the present invention has net design, able to block obstacle from the first external flow hole 1111, and keeps the first accommodating area 21 clean. Please refer to FIG. 3, the air enters into the first accommodating area 21 through the rear right side flow hole 1233 and the transmission flow holes 131, flows to the second main processor 145 and the memory devices 147 along with the first side heat leading tunnel 142, and exchanges the heat produced from the second main processor 145 and the memory devices 147.

The transmission circuit board 13 has a plurality of the transmission flow holes 131, so the air can flow from the third accommodating area 23 to the first accommodating area 21, and exchange heat. An flow hole located at upper transmission circuit board 13 as shown in FIG. 8, one of the transmission flow holes 131 is formed at upper transmission circuit board 13, so the air in the third accommodating area 23 flows through the transmission flow hole 131 into the first accommodating area 21 and the second main circuit board module 15; the air can flow from the third accommodating area 23 to the first accommodating area 21 through the transmission flow hole 131 formed at upper transmission circuit board 13, and exchange heat produced by the second main circuit board module 15. Four rectangular flow holes arrayed at lower transmission circuit board 13 as shown in FIG. 8, one of the transmission flow holes 131 can be formed at lower transmission circuit board 13, in present invention, four transmission flow holes has been formed, so the air in the third accommodating area 23 flows through the transmission flow hole 131 into the first accommodating area 21, then flows through the first main circuit board module 14 including the first main processor 144. These transmission flow holes 131 formed at lower transmission circuit board 13 can lead the air to the first main circuit board module 14, particularly the first main processor 144. The transmission flow holes 131 formed at the transmission circuit board 13 is considered and designed by the position and size of component, according to the principle of fluid mechanics as well, to find the best performance for heat exchange.

Figure 9:
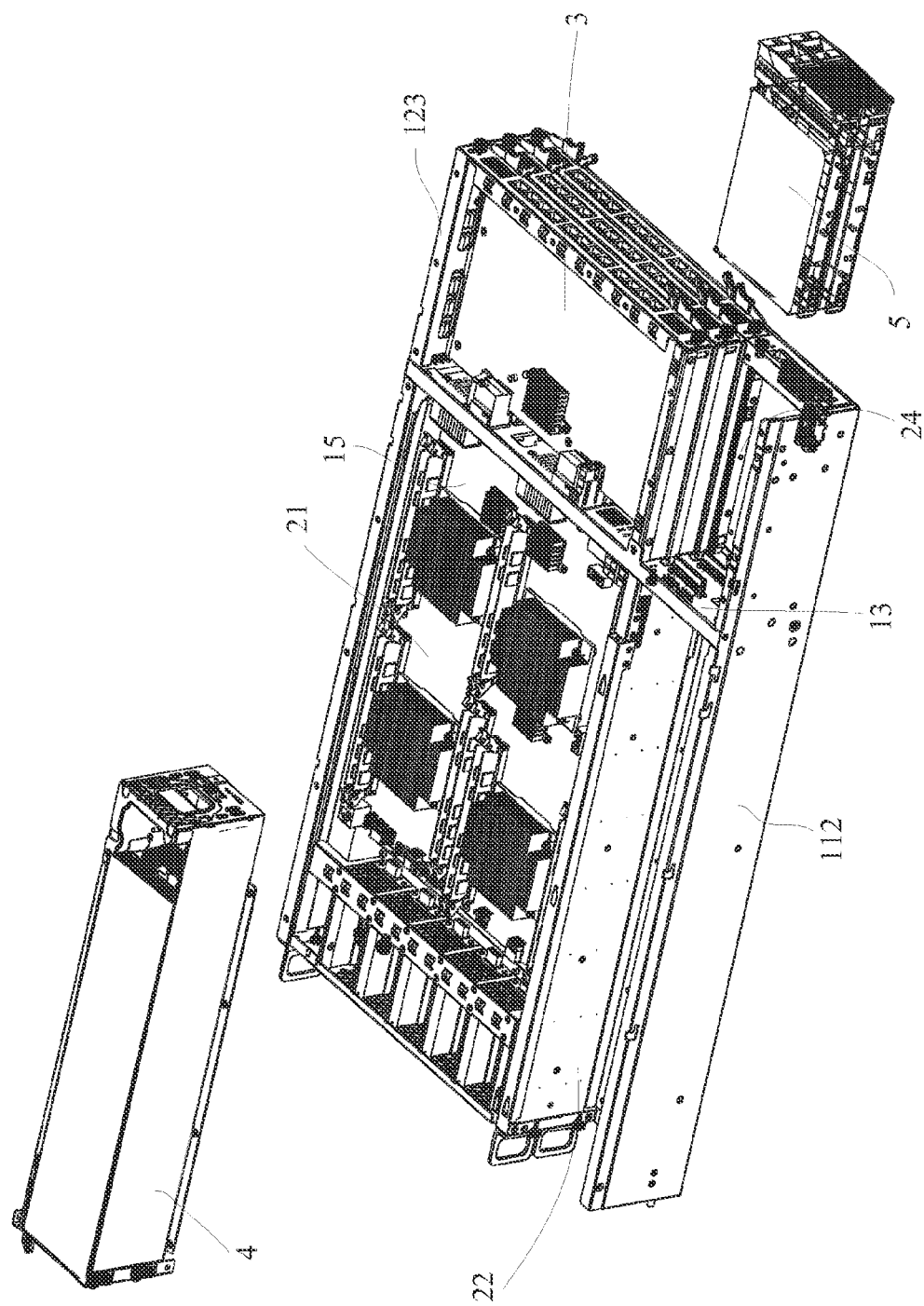
FIG. 9 demonstrates the power supplier and the data storage devices being disposed in the main case body according to the present invention.

As shown in FIG. 9, demonstrating the power supplier and the data storage devices being disposed in the main case body according to the present invention. The present invention further includes a power supplier 4, being disposed in the second accommodating area 22, drawing the air out of the second accommodating area 22, and connecting to the transmission circuit board 13; and a plurality of the data storage devices 5, being stacked and disposed in the forth accommodating area 24, and connecting to the transmission circuit board 13. The power supplier 4 provides power to the electrical signal computing module through the transmission circuit board 13, including the first main circuit board module 14, second main circuit board module 15, the internet printed circuit board 3 and the data storage devices 5. The power supplier 4 has blower able to draw the air out of the second accommodating area 22. The data storage devices 5 can store data for system software, and the capacity of each data storage device 5 can be changed as custom request.

Please follow the above description, also refer to FIGS. 1 to 4. The power supplier 4 has been introduced, the blower of the power supplier 4 able to draw the air out of the second accommodating area 22, also draw the heat out of the main case body 1. The air in the forth accommodating area 24 flows into the second accommodating area 22 through the transmission flow holes 131 of the transmission circuit board 13 after the air is drew out of the second accommodating area 22. As shown in FIG. 8, several flow holes are formed on the left half of the transmission circuit board 13, including two transmission flow holes 131 in line, and the air can flow from the forth accommodating area 24 to the second accommodating area 22, so that, the heat produced by the data storage device 5 can flow from the forth accommodating area 24 to the second accommodating area 22, and is drew out of the main case body 1. Meanwhile, part of the air in the second accommodating area 22 can also flow into the first accommodating area 21 through the front middle flow hole 1221, exchange the heat produced by the second main circuit board module 15 as flowing through the second main circuit board module 15, and the upper blowers 151 draw the air of the first accommodating area 21. In practice, minor air in the forth accommodating area 24 can flow to the third accommodating area 23. The transmission circuit board 13 has three arrayed connectors disposed in middle as shown in FIG. 8, a transmission flow hole 131 formed in rectangular is disposed by the left of the connectors, the air from the forth accommodating area 24 flowing to the third accommodating area 23 can flow to the first accommodating area 21 through the transmission flow hole 131.

Figure 2:
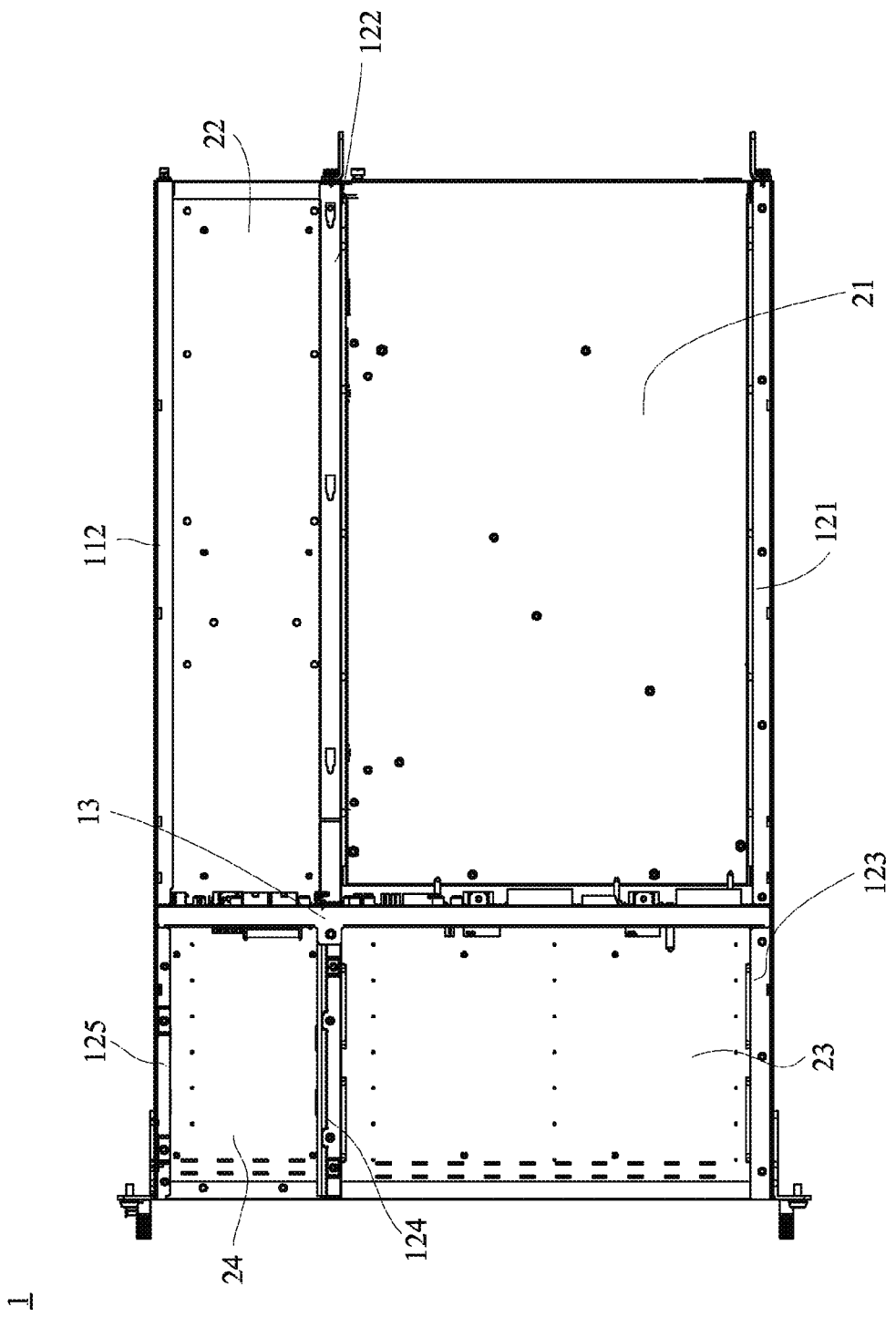
FIG. 2 demonstrates a top plan view of the main case body according to the present invention.
Figure 3:
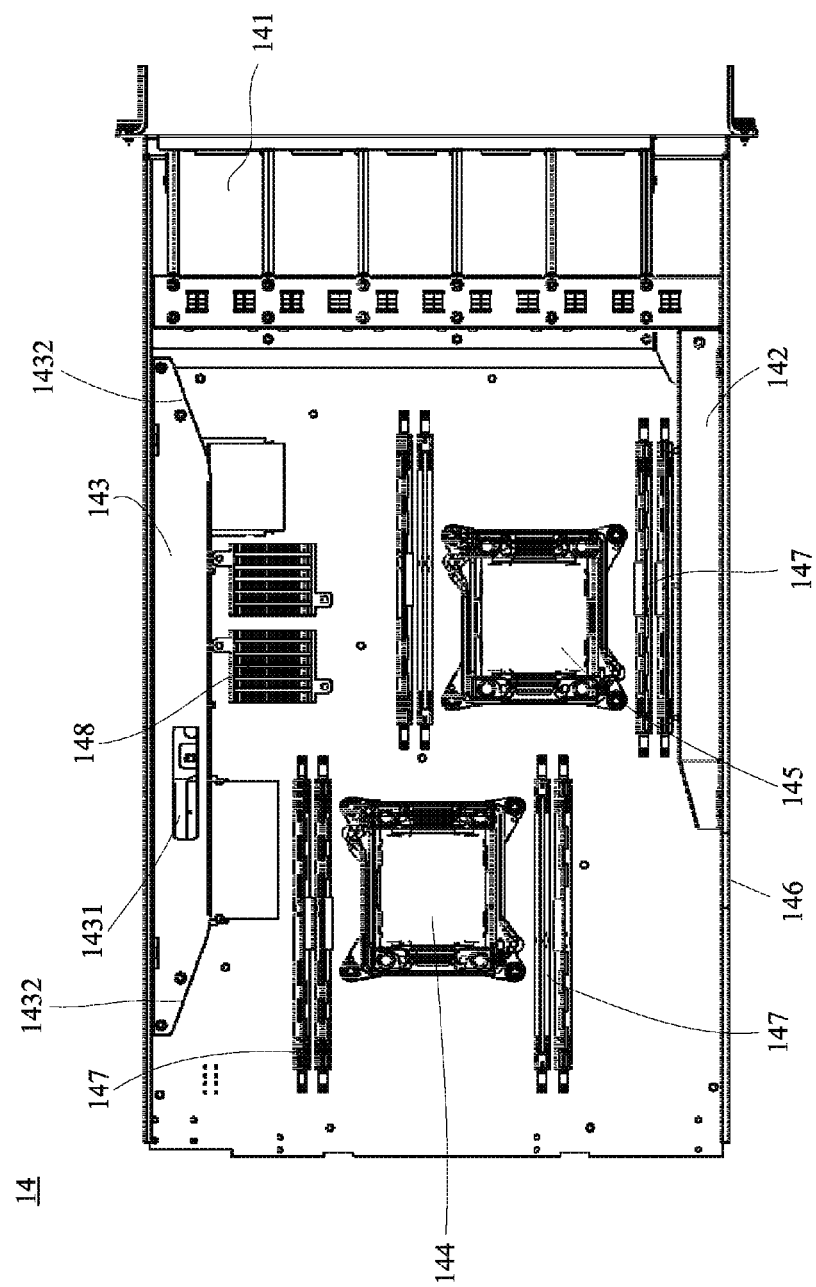
FIG. 3 demonstrates a top plan view of the first main circuit board module according to the present invention.
Figure 4:
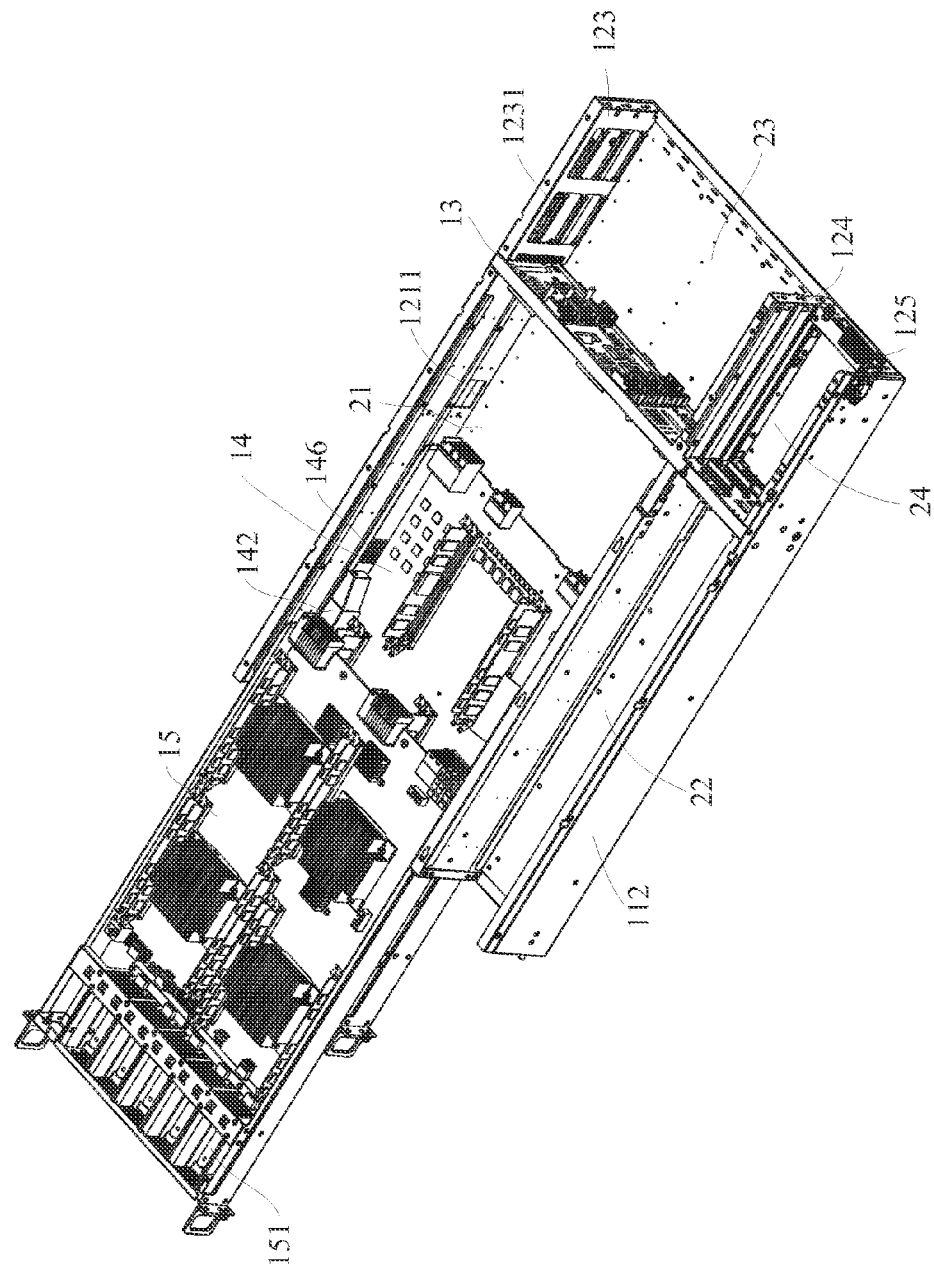
FIG. 4 demonstrates the first main circuit board module and the second main circuit board module being disposed in the first accommodating area according to the present invention.
Figure 10:
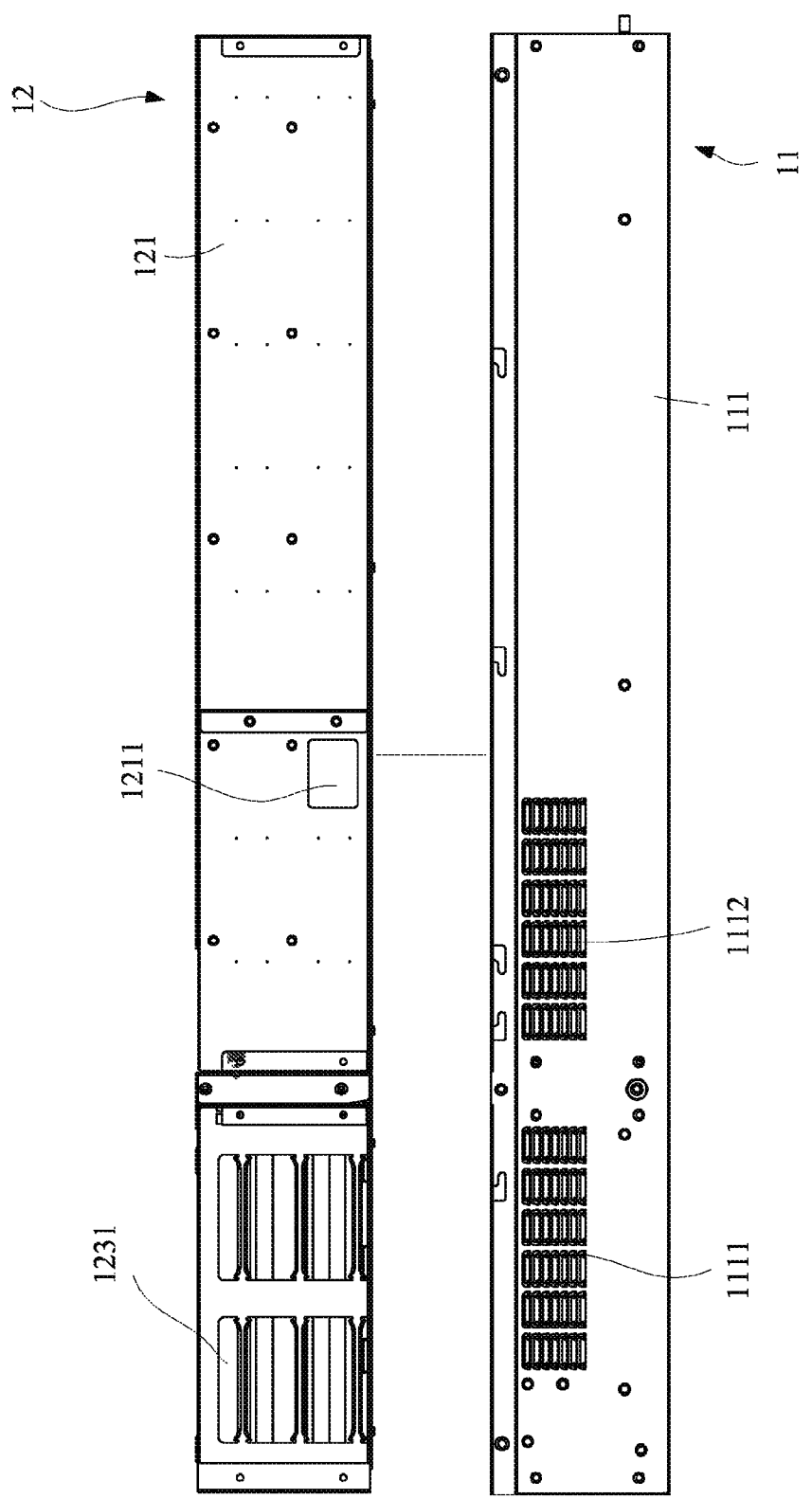
FIG. 10 demonstrates a side view of the internal board set being disposed within the bottom case according to the present invention.
Figure 11:
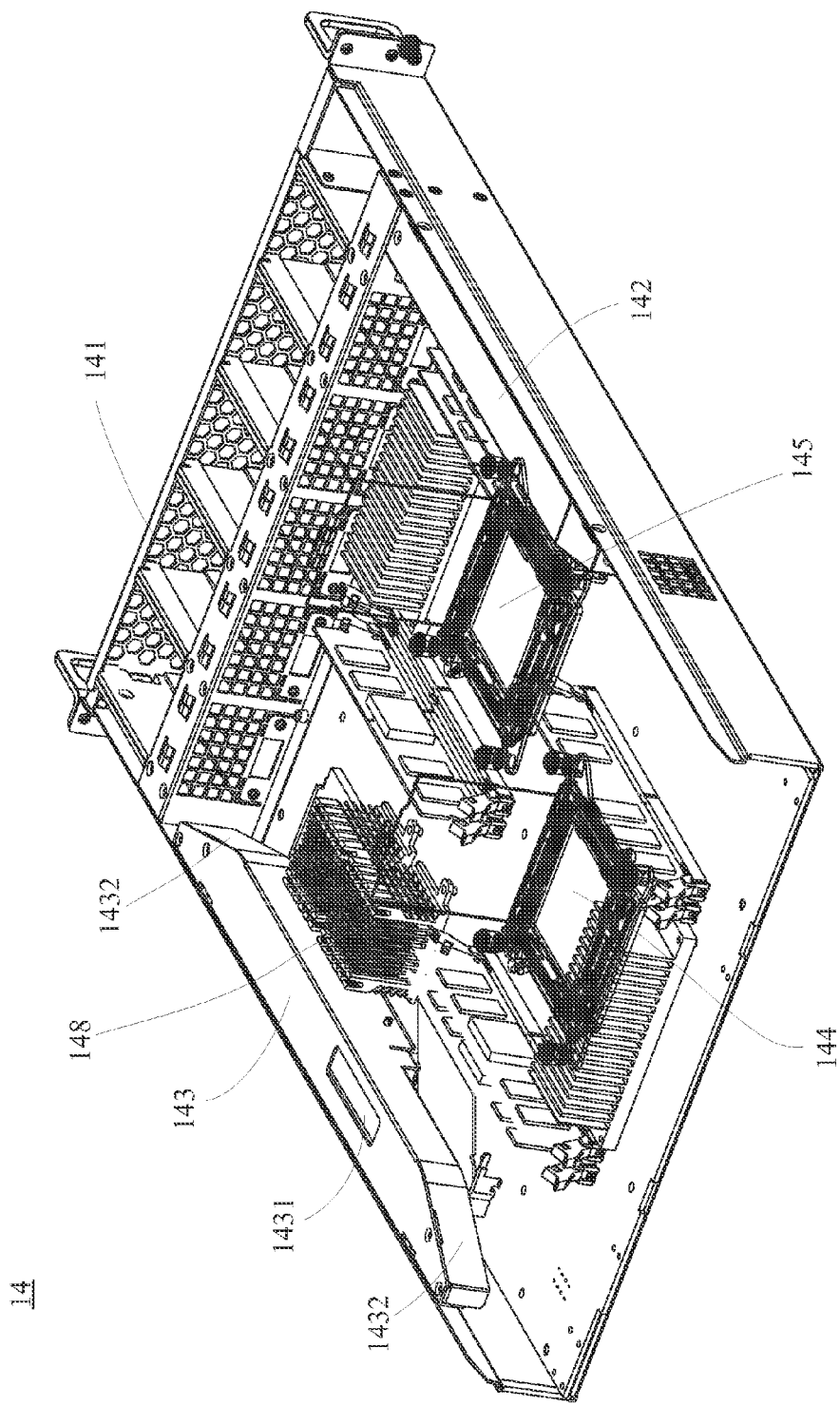
FIG. 11 demonstrates a stereo view of the first main circuit board module according to the present invention.

Please refer to FIGS. 2, 10 and 11. The FIG. 10 demonstrates a side view of the internal board set being disposed within the bottom case according to the present invention, FIG. 11 demonstrates a stereo view of the first main circuit board module according to the present invention. As a side view shown in FIG. 10, the first external flow holes 1111 and the second external flow holes 1112 are formed at upper external right side board 111 with numerous holes, and have cover structure at each hole, to keep obstacle out. Furthermore, The front side flow hole 1211 is formed at lower front right side board 121 with a block bending plate aside, so that, the air is blocked by the block bending plate after flowing in from the second external flow holes 1112, and all flows into the first accommodating area 21 through the front side flow hole 1211, exchanges the heat produced by the first main circuit board module 14 as well. The first main circuit board module 14 can produce certain heat, with the second main circuit board module 15 disposing above, the heat produced by the first main circuit board module 14 has limit air to exchange heat. Thus, the present invention designs the front side flow hole 1211, with differential height to the second external flow holes 1112, able to accelerate the fluid speed, exchange the heat produced by the first main circuit board module 14 rapidly. Moreover, the first external flow holes 1111 are disposed by the rear right side flow holes 1231 directly, able to provide certain amount of exterior air to the third accommodating area 23. In addition, as shown in FIG. 8, another block bending plate is disposed between the rear right side flow holes 1231 and the front side flow hole 1211, able to block the air flows to the front side flow hole 1211 after entering from the first external flow holes 1111.

As shown in FIGS. 1, 2 and 11. A first leading surface 1421 is formed at the first side heat leading tunnel 142, and the first side heat leading tunnel 142 connects to the lower blowers 141; the air flows into the first accommodating area 21 through the side heat flow hole 146, then flows to the second main processor 145 along with the first leading surface 1421, and the lower blowers 141 draw the air out of the first accommodating area 21. The first side heat leading tunnel 142 is able to lead more air to the second main processor 145. The second main processor 145 can produce large amount of heat with high work rate, the air from the third accommodating area 23 hardly exchanges heat with the second main processor 145 after exchanging with the first main processor 144 though. Thus, the present invention designs the front side flow hole 1211, to guide more exterior air from outside of the main case body 1 into the first accommodating area 21, and the first side heat leading tunnel 142 lead the air to the second main processor 145, so the second main processor 145 has more air to exchange heat. The one side of the first side heat leading tunnel 142 connects to the lower blowers 141 directly without space, so preventing turbulence in space.

The first main circuit board module 14 further has a host bridge microchip 148 closed to the second side heat leading tunnel 143. The host bridge microchip 148 is adopted for calculation, and produces heat too, thus, heat sink can be disposed on the host bridge microchip 148. The second side heat leading tunnel 143 has a distribution flow hole 1431, and two second leading surfaces 1432 are formed on two sides of the second side heat leading tunnel 143 respectively. The air flows from the third accommodating area 23 to the first accommodating area 21, through the host bridge microchip 148 along with one second leading surface 1432, and the lower blowers 141 draw the air out of the first accommodating area 21 along with another second leading surface 1432. The air from the third accommodating area 23 hardly exchanges heat with the host bridge microchip 148 after exchanging with the first main processor 144, thus, the present invention distributes the air from the second accommodating area 22 to the first accommodating area 21, and the host bridge microchip 148 has enough air to exchange heat. The air exchanges the heat produced by the host bridge microchip 148, flows along with another second leading surface 1432, and is drew out by the lower blowers 141. The second leading surface 1432 accelerates the fluid flow, so enhancing heat exchanging. Moreover, electrical components can disposed under the second side heat leading tunnel 143, also produce heat, thus, the present invention designs the distribution flow hole 1431 to exchange heat produced by the electrical component with more air flow path.

The present invention provides an electrical signal computing module having numerous printed circuit boards disposed in limit space with the best performance, the exterior air can be lead into the main case body to exchange heat produced by the printed circuit boards. With the structure designed by the present invention, the heat can be removed and lead out of the main case body efficiently, without accumulation of heat and damage of the printed circuit board. The structure of the present invention is designed according to the fluid mechanics under discretion to the efficiency of the heat exchange, so that, the cost can be saved and controlled by efficient heat exchange and space usage.

While the invention has been described by means of specific embodiments, numerous modifications and variations could be made thereto by those skilled in the art without departing from the scope and spirit of the invention set forth in the claims.

Moreover, the scope of the present invention should not be limited by the processes, devices, means, methods and steps of the embodiment in the specification. The person who has certain skill in this art can easily understand from the disclosure of the present invention, and exercise the processes, devices, means, methods and steps based on the same result with the development in present or future meet the spirit of the invention, or based on the same function as the embodiment according to the present invention. Therefore, the scope of the claims in the present invention should include the processes, devices, means, methods and steps.

We claim:

1. An electrical signal computing module capable of accommodating printed circuit board, comprising:
    a main case body 1, including:
        a bottom case 11, having an external right side board 111 and an external left side board 112, wherein the external right side board 111 has a first external flow hole 1111 and a second external flow hole 1112;
    an internal board set 12, being disposed within the bottom case 11, and further including:
        a front right side board 121, fixing to the external right side board 111, and having a front side flow hole 1211; wherein air flows in sequence through the second external flow hole 1112 and the front side flow hole 1211 into the main case body 1;
        a front middle board 122, having a front middle flow hole 1221;
        a rear right side board 123, fixing to the external right side board 111, and having a plurality of rear right side flow holes 1231; wherein the rear right side flow holes 1231 are formed by the first external flow hole 1111;
        a rear middle board 124; and a rear left side board 125, fixing to the external left side board 112;

a transmission circuit board 13, being disposed within the bottom case 11, and having a plurality of transmission flow holes 131; wherein a first accommodating area 21 is formed by the transmission circuit board 13, the front right side board 121 and the front middle board 122; a second accommodating area 22 is formed by the transmission circuit board 13, the front middle board 122 and the external left side board 112; a third accommodating area 23 is formed by the transmission circuit board 13, the rear right side board 123 and the rear middle board 124; a forth accommodating area 24 is formed by the transmission circuit board 13, the rear middle board 124 and the rear left side board 125; wherein the air flows in sequence through the first external flow hole 1111 and the rear right side flow holes 1231 into the third accommodating area 23; wherein the air flows from the third accommodating area 23 through the transmission flow holes 131 into the first accommodating area 21; wherein the air flows from the second accommodating area 22 through the front middle flow hole 1221 into the first accommodating area 21;

a first main circuit board module 14, being disposed in the first accommodating area 21, connecting to the transmission circuit board 13, and further having a plurality of lower blowers 141, a first side heat leading tunnel 142, a second side heat leading tunnel 143, a first main processor 144, a second main processor 145, a side heat flow hole 146 and a plurality of memory devices 147; wherein the lower blowers 141 are disposed in front of the first main circuit board module 14, and draw the air out of the first accommodating area 21; the first side heat leading tunnel 142 is disposed on right side of the first main circuit board module 14, and close to the side heat flow hole 146; the second side heat leading tunnel 143 is disposed on left side of the first main circuit board module 14; the first main processor 144 is disposed on the first main circuit board module 14 and close to the transmission circuit board 13; the second main processor 145 is disposed on the first main circuit board module 14 and close to the first side heat leading tunnel 142; the side heat flow hole 146 is disposed on right side of the first main circuit board module 14; the memory devices 147 flank the second main processor 145; wherein the lower blowers 141 draw the air out of the first accommodating area 21, so the air from external of the bottom case 11 flows in sequence through the front side flow hole 1211 and the side heat flow hole 146 into the first accommodating area 21 and the second main processor 145; and a second main circuit board module 15, being disposed in the first accommodating area 21, and being above the first main circuit board module 14, also connecting to the transmission circuit board 13; wherein the second main circuit board module 15 has a plurality of upper blowers 151, the upper blowers 151 are disposed in front of the second main circuit board module 15, and draw the air out of the first accommodating area 21; wherein, the lower blowers 141 and the upper blowers 151 draw the air out of the first accommodating area 21, so the air in the third accommodating area 23 flows into the first accommodating area 21, and the air in the forth accommodating area 24 flows into the second accommodating area 22; wherein the air on the first main circuit board module 14 flows through the first main processor 144, the memory devices 147 and the second main processor 145, the lower blowers 141 then draw the air out of the first accommodating area 21; wherein the air in the second accommodating area 22 flows through the front middle flow hole 1221 into the second main circuit board module 15, the upper blowers 151 then draw the air out of the first accommodating area 21.

2. The electrical signal computing module capable of accommodating printed circuit board of claim 1, wherein the rear right side board 123 further has a plurality of first printed circuit board supporters 1232 formed at interior of the rear right side flow holes 1231 respectively.

3. The electrical signal computing module capable of accommodating printed circuit board of claim 2, wherein the rear middle board 124 has a plurality of second printed circuit board supporters 1241 corresponding to the first printed circuit board supporters 1232.

4. The electrical signal computing module capable of accommodating printed circuit board of claim 3, further comprising a plurality of internet printed circuit boards 3 being disposed in the third accommodating area 23, connecting to the transmission circuit board 13; wherein each internet printed circuit board 3 is supported by the first printed circuit board supporter 1232 and the second printed circuit board supporter 1241.

5. The electrical signal computing module capable of accommodating printed circuit board of claim 1, wherein the rear right side board 123 further has a rear right side flow hole 1233 formed at side of the rear right side board 123, and communicating to the first external flow hole 1111.

6. The electrical signal computing module capable of accommodating printed circuit board of claim 5, wherein one of the transmission flow holes 131 is formed at side of the transmission circuit board 13, and communicates with the rear right side flow hole 1233; wherein the air flows through the first external flow hole 1111, the rear right side flow hole 1233 and the transmission flow hole 131 in sequence to the first accommodating area 21, then the air is led by the first side heat leading tunnel 142 to the second main processor 145.

7. The electrical signal computing module capable of accommodating printed circuit board of claim 1, wherein one of the transmission flow holes 131 is formed at upper transmission circuit board 13, so the air in the third accommodating area 23 flows through the transmission flow hole 131 into the first accommodating area 21 and the second main circuit board module 15; wherein one of the transmission flow holes 131 is formed at lower transmission circuit board 13, so the air in the third accommodating area 23 flows through the transmission flow hole 131 into the first accommodating area 21, then flows through the first main circuit board module 14 including the first main processor 144.

8. The electrical signal computing module capable of accommodating printed circuit board of claim 1, further including:

a power supplier 4, being disposed in the second accommodating area 22, drawing the air out of the second accommodating area 22, and connecting to the transmission circuit board 13; and a plurality of the data storage devices 5, being stacked and disposed in the forth accommodating area 24, and connecting to the transmission circuit board 13.

9. The electrical signal computing module capable of accommodating printed circuit board of claim 1, wherein a first leading surface 1421 is formed at the first side heat leading tunnel 142, and the first side heat leading tunnel 142 connects to the lower blowers 141; the air flows into the first accommodating area 21 through the side heat flow hole 146, then flows to the second main processor 145 along with the first leading surface 1421, and the lower blowers 141 draw the air out of the first accommodating area 21.

10. The electrical signal computing module capable of accommodating printed circuit board of claim 1, wherein the first main circuit board module 14 further has a host bridge microchip 148 closed to the second side heat leading tunnel 143.

11. The electrical signal computing module capable of accommodating printed circuit board of claim 10, wherein the second side heat leading tunnel 143 has a distribution flow hole 1431, and two second leading surfaces 1432 are formed on the second side heat leading tunnel 143; the air flows to the second side heat leading tunnel 143, and the distribution flow hole 1431 distributes the air to flow on the second side heat leading tunnel 143; wherein the air flows from the third accommodating area 23 to the first accommodating area 21, through the host bridge microchip 148 along with one second leading surface 1432, and the lower blowers 141 draw the air out of the first accommodating area 21 along with another second leading surface 1432.

* * * * *